(12) United States Patent
Chen et al.

(10) Patent No.: US 12,271,597 B2
(45) Date of Patent: Apr. 8, 2025

(54) MEMORY ORGANIZATION FOR MULTI-MODE SUPPORT

(71) Applicants: ATI Technologies ULC, Markham (CA); Advanced Micro Devices, Inc., Santa Clara, CA (US)

(72) Inventors: Xuan Chen, Richmond Hill (CA); Ross V. La Fetra, Sunnyvale, CA (US); Michael John Litt, Toronto (CA)

(73) Assignees: ATI Technologies ULC, Markham (CA); Advanced Micro Devices, Inc., Santa Clara, CA (US)

( * ) Notice: Subject to any disclaimer, the term of this patent is extended or adjusted under 35 U.S.C. 154(b) by 26 days.

(21) Appl. No.: 17/981,982

(22) Filed: Nov. 7, 2022

(65) Prior Publication Data

US 2023/0280906 A1    Sep. 7, 2023

Related U.S. Application Data

(60) Provisional application No. 63/315,749, filed on Mar. 2, 2022.

(51) Int. Cl.
*G06F 3/06* (2006.01)

(52) U.S. Cl.
CPC .......... *G06F 3/0613* (2013.01); *G06F 3/0629* (2013.01); *G06F 3/0673* (2013.01)

(58) Field of Classification Search
CPC ..... G06F 3/0613; G06F 3/0629; G06F 3/0673
USPC ........................................................ 711/105
See application file for complete search history.

(56) References Cited

U.S. PATENT DOCUMENTS

| | | | |
|---|---|---|---|
| 8,796,863 B2 * | 8/2014 | Lee | H10B 12/00 257/778 |
| 11,074,952 B1 * | 7/2021 | Schnell | G11C 5/066 |
| 12,026,400 B2 * | 7/2024 | Kim | G06F 3/061 |
| 2007/0076008 A1 * | 4/2007 | Osborne | G06T 1/60 345/541 |
| 2011/0193086 A1 * | 8/2011 | Lee | H01L 25/0657 257/E27.11 |
| 2013/0021760 A1 * | 1/2013 | Kim | H01L 24/92 257/773 |
| 2013/0049223 A1 * | 2/2013 | Nomoto | G11C 5/02 257/774 |
| 2014/0297393 A1 * | 10/2014 | Phillipps | G06Q 20/18 705/14.39 |
| 2014/0346516 A1 | 11/2014 | Lee et al. | |
| 2015/0325521 A1 | 11/2015 | Nomoto et al. | |

(Continued)

OTHER PUBLICATIONS

International Search Report and Written Opinion for International Application No. PCT/US2023/013822 mailed Jun. 14, 2023, 8 pages.

(Continued)

*Primary Examiner* — Christopher B Shin
(74) *Attorney, Agent, or Firm* — Polansky & Associates, P.L.L.C.; Paul J. Polansky

(57) ABSTRACT

A memory package includes first, second, third, and fourth channels arranged consecutively in a clockwise direction on the memory package, each of the first, second, third, and fourth channels having access circuitry and memory arrays. In a first mode, the first channel controls access to the memory arrays in the second channel and the fourth channel controls access to the memory arrays in the third channel.

15 Claims, 8 Drawing Sheets

(56) References Cited

U.S. PATENT DOCUMENTS

| | | |
|---|---|---|
| 2017/0109091 A1* | 4/2017 | Gans .................... G06F 3/0629 |
| 2017/0192720 A1* | 7/2017 | Hong .................. G06F 13/1626 |
| 2018/0047436 A1 | 2/2018 | Shaeffer et al. |
| 2018/0373450 A1* | 12/2018 | Ji ............................ G06F 12/00 |
| 2019/0156870 A1* | 5/2019 | Park .................... G11C 7/1051 |
| 2020/0019344 A1 | 1/2020 | Lim |
| 2020/0251148 A1* | 8/2020 | Narui ...................... G11C 5/06 |
| 2020/0372941 A1 | 11/2020 | Park et al. |
| 2020/0411062 A1 | 12/2020 | Narui |

OTHER PUBLICATIONS

JEDEC Standard; white paper; "Graphics Double Data Rate (GDDR6) SGRAM Standard"; JESD250B; Revision of JESD250A, Jul. 2017; JEDEC Solid State Technology Association, 3103 North 10th Street, Suite 240S Arlington, Virginia, 22201; Jan. 2018; 200 pages.
Micron Technology, Inc.; technical note; "GDDR6: The Next-Generation Graphics DRAM"; TN-ED-03; Rev. A; 8000 S. Federal Way, P.O. Box 6, Boise, ID 83707-0006; Nov. 2017; 22 pages.

* cited by examiner

MEMORY ORGANIZATION FOR MULTI-MODE SUPPORT

This application claims priority to U.S. provisional application 63/315,749, filed Mar. 2, 2022, the entire contents of which are incorporated herein by reference.

BACKGROUND

Modern dynamic random-access memory (DRAM) provides high memory bandwidth by increasing the speed of data transmission on the bus connecting the DRAM and one or more data processors, such as graphics processing units (GPUs), central processing units (CPUs), and the like. DRAM is typically inexpensive and high density, thereby enabling large amounts of DRAM to be integrated per device. Most DRAM chips sold today are compatible with various double data rate (DDR) DRAM standards promulgated by the Joint Electron Devices Engineering Council (JEDEC). Typically, several DDR DRAM chips are combined onto a single printed circuit board substrate to form a memory subsystem that can provide not only relatively high speed but also scalability. However, while these enhancements have improved the speed of DDR memory used for computer systems' main memory, further improvements are desirable.

One type of DDR DRAMs, known as graphics double data rate (GDDR) memory, has pushed the boundaries of data transmission rates to accommodate the high bandwidth needed for graphics applications. In addition to high bandwidth, however, it is important to allow for the DRAM package to be configured for multiple applications. For example, GDDR, version six (GDDR6) DRAM has two independent 16-bit channels, in which each channel can be configured in a by-16 (×16) mode or a ×8 mode. In the ×16 mode, the DRAM provides the two 16-bit channels by selecting all 16-bits on each of the two channels. In the ×8 mode, each 16-bit system channel is provided by data from the two DRAM packages, each contributing eight bits, with each DRAM package stacking the unused eight bits to double the memory depth. The addresses of the ganged channels are tied together so each does the same commands and so operates in parallel in lock step. In the ×8 mode, the number of DRAM packages and the depth of the memory are doubled.

Recently, JEDEC has been considering a revision to the GDDR standard that provides greater flexibility. According to this new revision, the GDDR DRAM provides four ×8 channels. In 4-channel mode, there is a single DRAM package, and each of the system's four channels is provided by a selected one of the DRAM package's four channels. In a 2-channel mode, however, each DRAM package supplies two of the system's four channels, and the unused channels are stacked internally as increased memory depth. The effect of the 2-channel mode is to double the number of DRAM packages and the depth of the memory. To implement this flexibility, the new GDDR DRAM is organized into an initiator-target configuration, in which each initiator channel has its own memory plus the memory from its paired target channel available. Moreover, this initiator-target configuration allows either a single package placed on the top PCB surface with each channel independently accessible in a four-channel (4CH) mode, or one package placed on the top PCB surface and another package placed on the bottom PCB surface in a so-called "clamshell" configuration to support a two-channel (2CH) mode. However, since graphics controllers and GDDR memory are large and power-hungry, the clamshell configuration requires backside cooling, increasing system cost.

Figure 1:
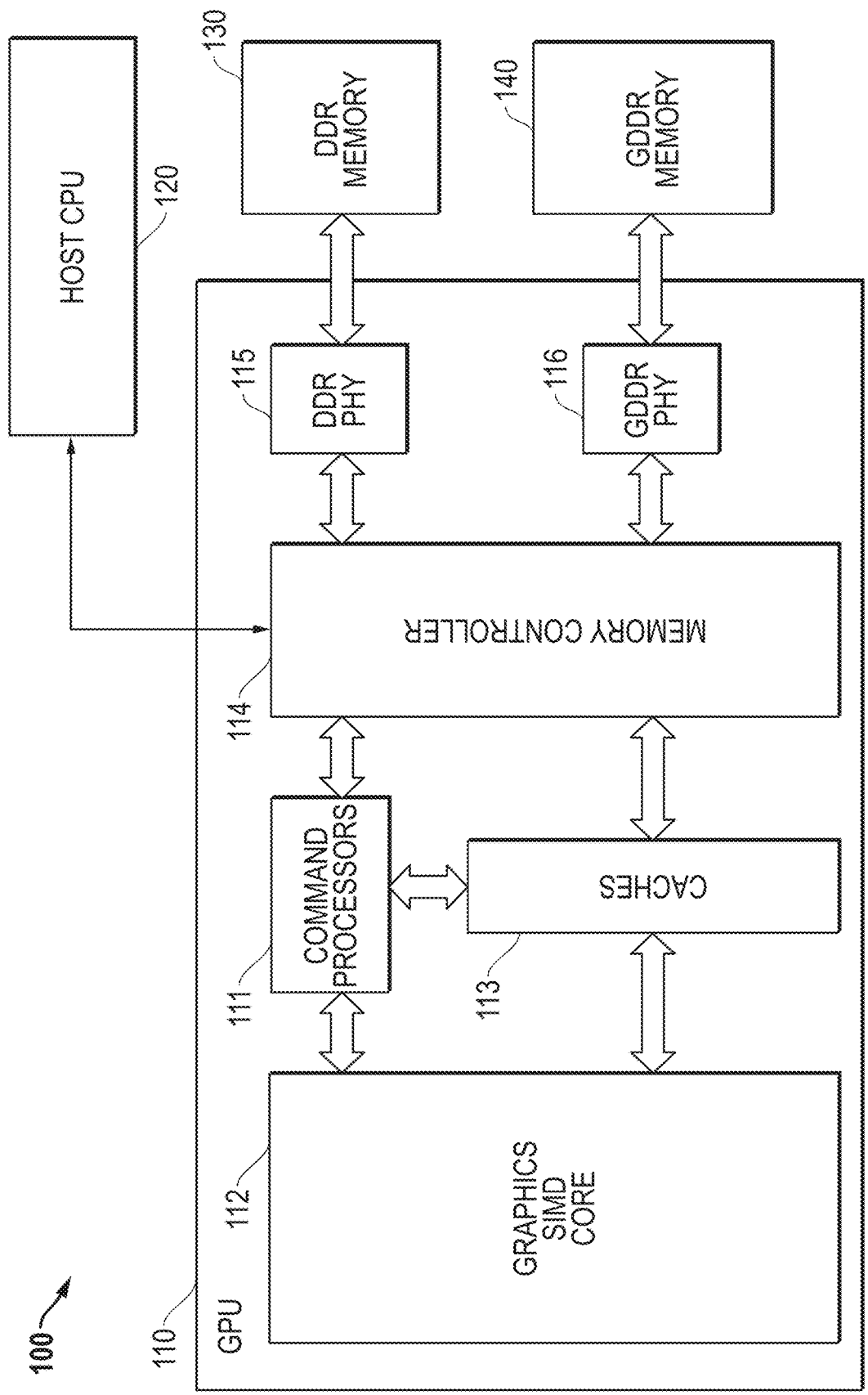
FIG. 1 illustrates in block diagram form a data processing system according to some embodiments.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

A memory package includes first, second, third, and fourth channels arranged consecutively in a clockwise direction on the memory package. Each of the first, second, third, and fourth channels have access circuitry and memory arrays. In a first mode, the first channel controls access to the memory arrays in the second channel and the fourth channel controls access to the memory arrays in the third channel.

A layout of a circuit board includes a first memory package and a second memory package. Each of the first and second memory package includes first, second, third, and fourth channels arranged consecutively in a clockwise direction. Each of the first, second, third, and fourth channels have memory arrays. The first and fourth channels include initiator channels and exhibit vertical symmetry around a horizontal middle line. The second and third channels include target channels and exhibit vertical symmetry around the horizontal middle line. The first and second channels exhibit horizontal symmetry around a vertical center line. The third and fourth channels further exhibit horizontal symmetry around the vertical center line.

A method of operating a memory system by a processor includes selectively accessing a first memory channel, including accessing a first memory package mounted on a first side of a printed circuit board by the processor communicating signals using first channel traces to a left side of the first memory package with respect to a reference line of the printed circuit board. The first channel traces have a predetermined flat order from left to right. The method also includes selectively accessing a second memory channel, including accessing a second memory package mounted on the first side of the printed circuit board by the processor communicating signals using second channel traces to a right side of the second memory package with respect to the reference line of the printed circuit board. The second channel traces have the first flat order in a reverse order.

FIG. 1 illustrates in block diagram form a data processing system 100 according to some embodiments. Data processing system 100 includes generally a data processor in the form of a graphics processing unit (GPU) 110, a host central processing unit (CPU) 120, a double data rate (DDR) memory 130, and a graphics DDR (GDDR) memory 140.

GPU 110 is a discrete graphics processor that has extremely high performance for optimized graphics processing, rendering, and display, but requires a high memory bandwidth for performing these tasks. GPU 110 includes generally a set of command processors 111, a graphics single instruction, multiple data (SIMD) core 112, a set of caches 113, a memory controller 114, a DDR physical interface circuit (DDR PHY) 115, and a GDDR PHY 116. While a GPU is shown in this implementation, GPU 110 may be one of a variety of data processing elements such as a machine-learning parallel accelerated processor.

Command processors 111 are used to interpret high-level graphics instructions such as those specified in the OpenGL programming language. Command processors 111 have a bidirectional connection to memory controller 114 for receiving high-level graphics instructions such as OpenGL instructions, a bidirectional connection to caches 113, and a bidirectional connection to graphics SIMD core 112. In response to receiving the high-level instructions, command processors issue low-level instructions for rendering, geometric processing, shading, and rasterizing of data, such as frame data, using caches 113 as temporary storage. In response to the graphics instructions, graphics SIMD core 112 performs low-level instructions on a large data set in a massively parallel fashion. Command processors 111 and caches 113 are used for temporary storage of input data and output (e.g., rendered and rasterized) data. Caches 113 also have a bidirectional connection to graphics SIMD core 112, and a bidirectional connection to memory controller 114.

Memory controller 114 has a first upstream bidirectional port connected to command processors 111, a second upstream bidirectional port connected to caches 113, a first downstream bidirectional port to DDR PHY 115, and a second downstream bidirectional port to GDDR PHY 116. As used herein, "upstream" ports are on a side of a circuit toward a data processor and away from a memory, and "downstream" ports are in a direction away from the data processor and toward a memory. Memory controller 114 controls the timing and sequencing of data transfers to and from DDR memory 130 and GDDR memory 140. DDR and GDDR memory have asymmetric accesses, that is, accesses to open pages in the memory are faster than accesses to closed pages. Memory controller 114 stores memory access commands and processes them out-of-order for efficiency by, e.g., favoring accesses to open pages, while observing certain quality-of-service objectives.

DDR PHY 115 has an upstream bidirectional port connected to the first downstream port of memory controller 114, and a downstream port bidirectionally connected to DDR memory 130. DDR PHY 115 meets all specified timing parameters of the version of DDR memory 130, such as DDR version five (DDR5), and performs timing calibration operations at the direction of memory controller 114.

Likewise, GDDR PHY 116 has an upstream port connected to the second downstream port of memory controller 114, and a downstream port bidirectionally connected to GDDR memory 140. GDDR PHY 116 meets all specified timing parameters of the version of GDDR memory 140, and performs timing calibration operations at the direction of memory controller 114. GDDR memory 140 includes a set of mode registers 141 programmable over the GDDR PHY 116 to configure GDDR memory 140 for operation.

In operation, data processing system 100 can be used as a graphics card or accelerator because of the high bandwidth graphics processing required for graphics applications. Host CPU 120, running an operating system or an application program, sends graphics processing commands to GPU 110 through DDR memory 130, which serves as a unified memory for GPU 110 and host CPU 120. It may send the commands using, for example, as OpenGL commands, or through any other host CPU to GPU interface. OpenGL is a cross-language, cross-platform application programming interface for rendering 2D and 3D vector graphics. Host CPU 120 uses an application programming interface (API) to interact with GPU 110 to provide hardware-accelerated rendering.

Data processing system 100 uses two types of memory. The first type of memory is DDR memory 130, and is accessible by both GPU 110 and host CPU 120. As part of the high performance of graphics SIMD core 112, GPU 110 uses a high-speed graphics double data rate (GDDR) memory.

Figure 2:
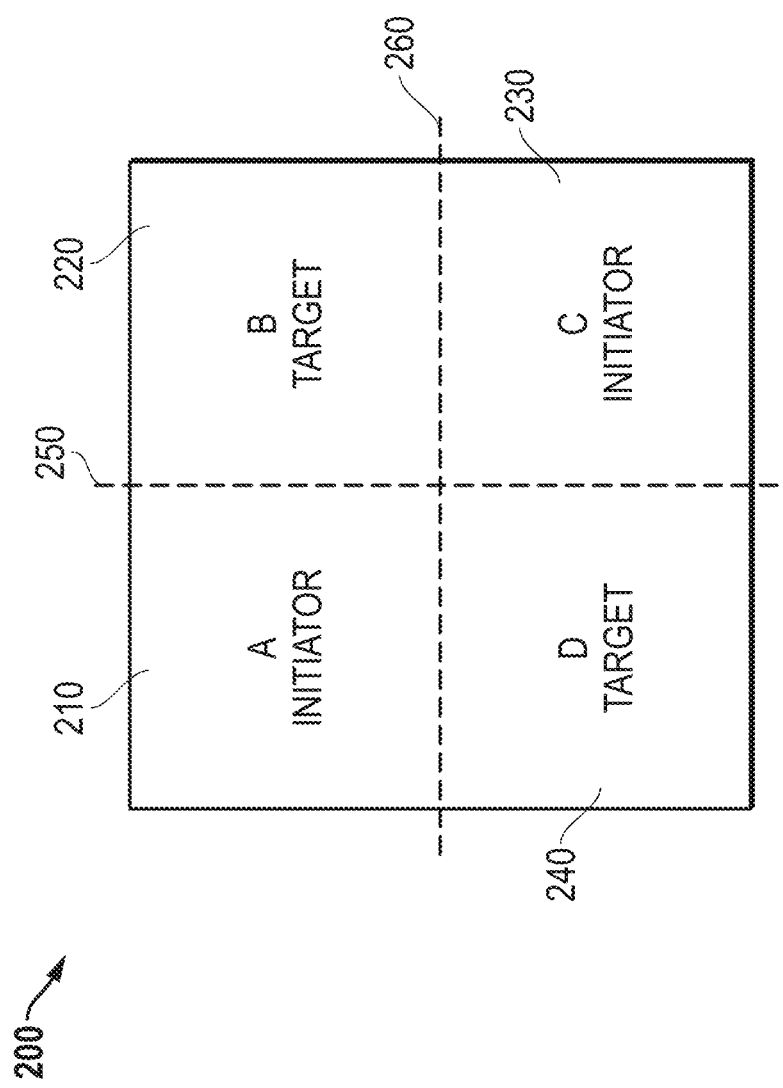
FIG. 2 illustrates in block diagram form a memory package according to the prior art.

FIG. 2 illustrates in block diagram form a memory package 200 according to the prior art. Memory package 200 is divided into four channels 210, 220, 230, and 240, which are in quadrants defined by a vertical middle line 250 and a horizontal center line 260. Channel 210 is known as channel "A" and is an initiator channel. Channel 220 is known as channel "B" and is a target channel. Channel 230 is known as channel "C" and is an initiator channel. Chanel 240 is known as channel "D" and is a target channel. In 2CH mode, channel 210 steers memory access requests to either its data or the data in channel 220, and returns data through the initiator's channel. Similarly, channel 230 steers memory access requests to either its data or the data in target channel 240, and returns data through the initiator's channel. In an alternate configuration, initiator channel A can control accesses to target channel D, and initiator channel C can control accesses to target channel B.

Memory package 200 shows an organization of channels in a memory package that can support either a single memory package on one surface or dual memory packages in a clamshell configuration. However, providing two memory packages in a clamshell configuration requires backside cooling, adding to product cost.

Figure 3:
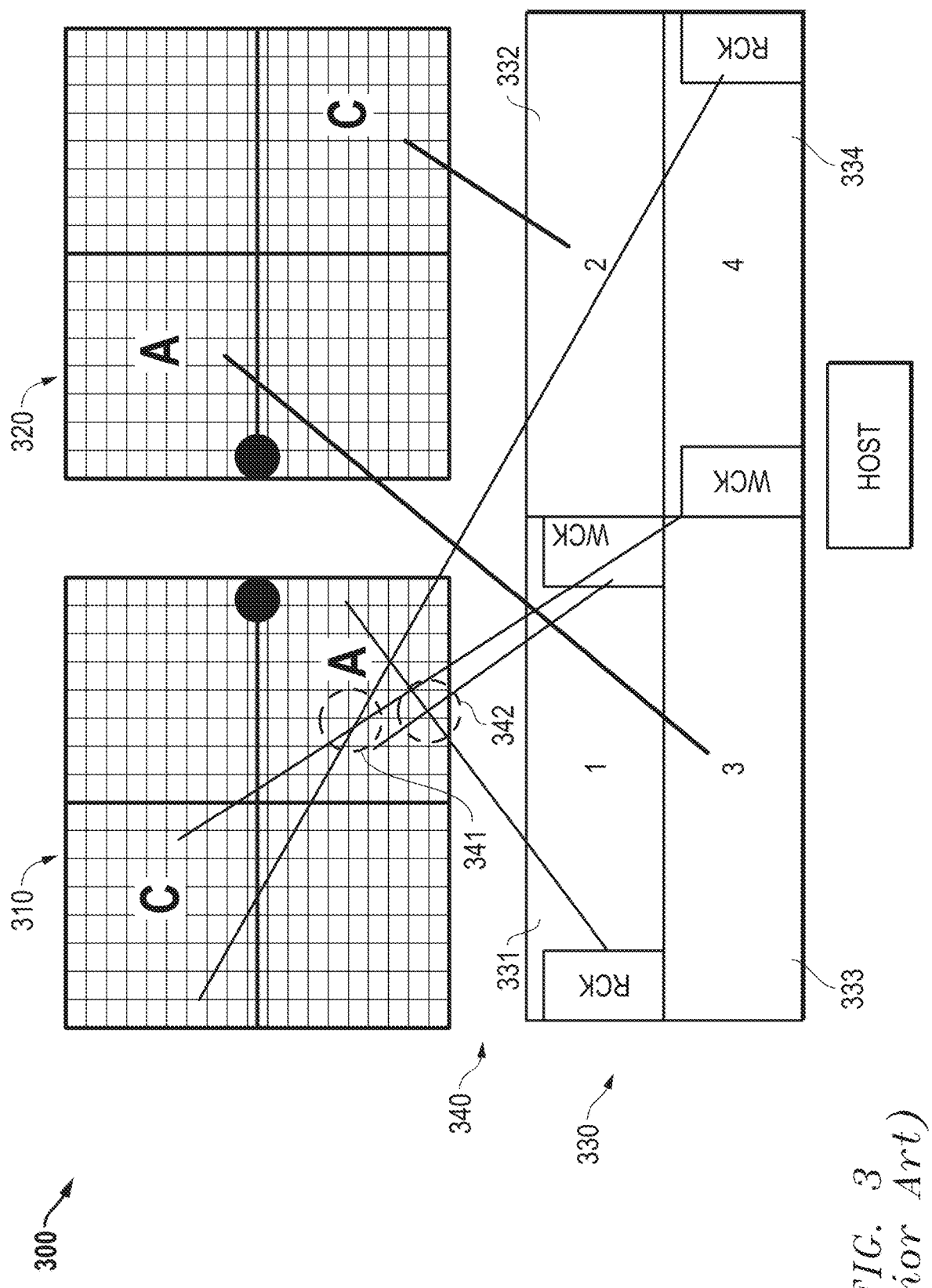
FIG. 3 illustrates in block diagram form a signal routing diagram for a data processing system using the memory of FIG. 2.

FIG. 3 illustrates in block diagram form a signal routing diagram for a data processing system 300 using memory package 200 of FIG. 2 in a two-channel, single side configuration. Data processing system 300 includes a memory packages 310 and 320, and a portion of a processor package 330. FIG. 3 shows that the channels having terminals on their bottom sides for contact with a PCB, such as when implemented with a BGA package. In other embodiments, other package types such as quad flat pack (QFP) could be used.

Data processing system 300 uses the channel organization of memory package 200 of FIG. 2, but orients the memory packages as follows. For memory package 310, initiator channel C is in the upper left corner of memory package 310 and initiator channel A is in the lower right corner. Memory package 320 is rotated 180 degrees with respect to the top direction, in which initiator channel A is in the upper left corner of memory package 310 and initiator channel C is in the lower right corner. Processor package 330 includes a first memory controller physical interface 331, a second memory controller physical interface 332, a third memory controller physical interface 333, and a fourth memory controller interface 334.

The signal routing diagram shows that with the organization of a memory package 200 shown in FIG. 2, there will be significant signal crossings that require one or more extra PCB layers, such as highlighted areas 341 and 342. Thus, the user will either implement a more complex and expensive circuit board design, or use the clamshell architecture but add backside cooling. In either case, implementing two-channel mode with two memory packages increases product cost significantly.

It would be desirable to implement a mode capable of supporting two memory packages on the same PCB surface using the same memory controller organization, without the need for extra PCB layers due to crossing routes or backside cooling. According to various embodiments disclosed herein, a new memory package organization allows the memory to be configured in a two-channel mode or a four-channel mode while avoiding these problems. For example, the organization allows four memory channels using a single package on a single side of the PCB, two channels on each of two sides in the 2CH clamshell mode with two memory packages, and two channels on a single side in the 2CH top-side mode memory packages all using a common controller organization without adding complex, crossing routes that require one or more extra PCB layers.

Figure 4:
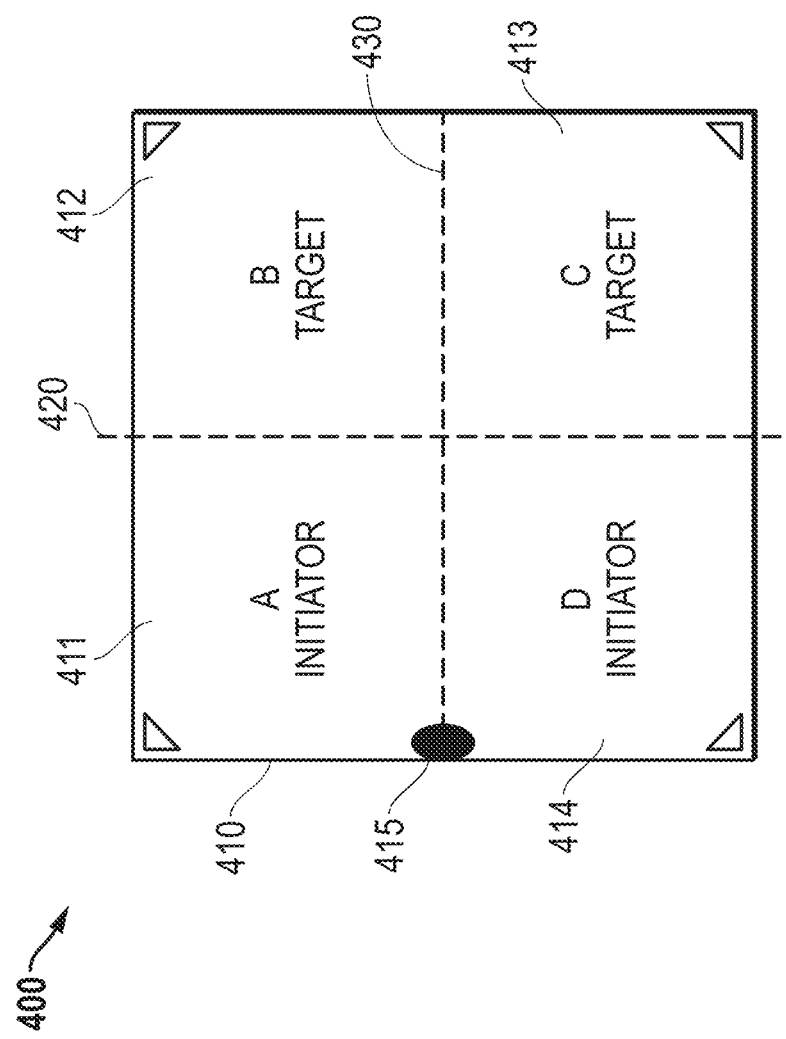
FIG. 4 illustrates in block diagram form a memory package according to some embodiments.

FIG. 4 illustrates in block diagram form a memory package 400 having 2-channel, same side capability according to some embodiments. Memory package 400 includes is divided into four channels 411, 412, 413, and 414, which are in quadrants defined by a vertical center line 420 and a horizontal middle line 430. As shown in FIG. 4, the channels are chamfered in which the chamfer identifies a reference point of the channel. A unique feature 415 at the left middle of memory package 400 can be used to identify an overall orientation of memory package 400. In the illustrated embodiment, the unique feature is a reset pin that is used to reset all channels, and there is only one reset pin per memory package.

Channel 411 is an "A" channel and is an initiator channel located in a top left corner. Channel 412 is a "B" channel and is a target channel. Channel 413 is a "C" channel and is also a target channel. Channel 414 is a "D" channel and is an initiator channel. In 2CH mode, channel 411 controls memory access requests to both its data and data in channel 412. Similarly, channel 414 controls memory access requests to both its data and data in channel 413. Memory package 400 shows the organization of channels in a memory package that can support either 4CH mode single memory package mode, 2CH clamshell dual memory package mode, and 2CH top-side dual memory package mode side-by-side on the top (or bottom) surface of the PCB.

Memory package 400 exhibits both horizontal symmetry around vertical center line 420, and vertical symmetry around a horizontal middle line 430. Horizontal symmetry means the initiator and target byte have substantially the same circuits mirrored around an axis of symmetry, in this example, vertical center line 420. The channels need not be identical, though, but they have horizontal symmetry in the sense that corresponding signals have the same flat order but in opposite directions. Thus, signal terminals on the right side of channel 411 occur on the left side of channel 412. This feature can be used for a host memory controller physical interface circuit (PHY) to itself have the same flat order but to be laid out in mirror image form on the processor package to provide substantial alignment of channel traces on the printed circuit board and to reduce or eliminate crossing signal routes. Unlike known memory package 200 of FIG. 2, memory package 400 does not have 180-degree rotational symmetry with respect to initiator and target channel placement, because the initiator quadrants are adjacent to each other. This characteristic allows it to support 2CH, single-side (top or bottom) dual memory package mode, thereby eliminating the need for backside cooling that is needed for the 2CH clamshell mode.

Figure 5:
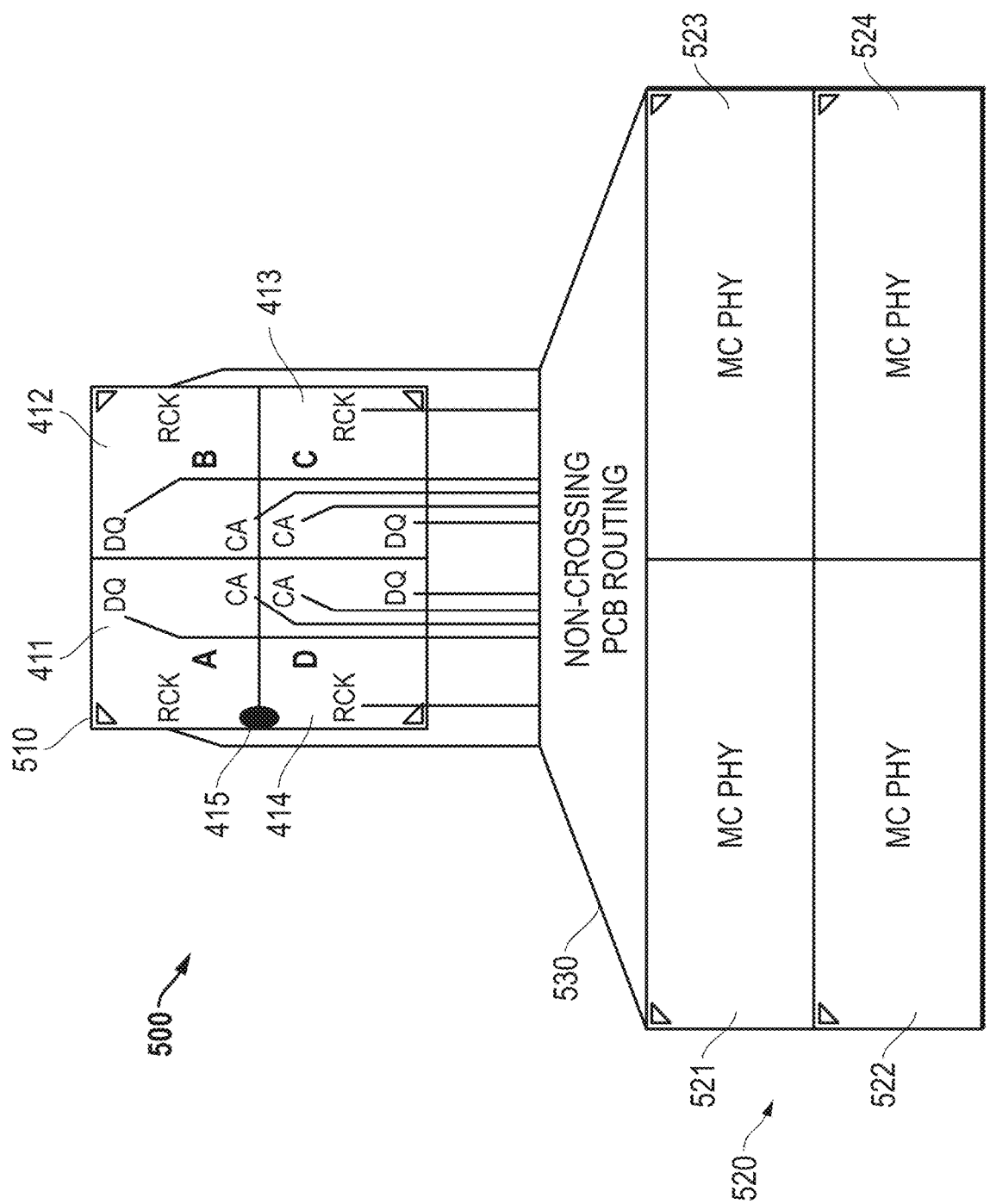
FIG. 5 illustrates in block diagram form a layout of a circuit board using one memory package of FIG. 4 according to some embodiments.

FIG. 5 illustrates in block diagram form a layout of a circuit board 500 using one memory package 400 of FIG. 4 in a four-channel mode according to some embodiments. Circuit board 500 forms a data processing system and includes generally a memory package 510, a memory controller area 520, and a non-crossing PCB routing 530 between the two. Memory package 510 is a memory package as shown in FIG. 4, with channel 411, the A channel, located in the top left corner, channel 412, the B channel, located in the top right corner, and so on, in which top and bottom are designated with respect to an edge of the memory package or with respect to a reference line on the memory package. For example, the reference line could be rotated by −45 degrees with respect to an edge of the memory package.

Memory controller area 520 includes a memory controller PHY channel 521 and a memory controller PHY channel 522 on a left half of memory controller area 520, and a memory controller PHY channel 523 and a memory controller PHY channel 524 on a right half of memory controller area 520. The left and right halves of memory controller area 520 have terminal patterns that are compatible with the terminal patterns of corresponding channels 411, 412, 413, and 414 of memory package 410. Memory controller PHY channels 521 and 523, and 522 and 524 only need to have terminal patterns that match the flat order of the terminal patterns of channels 411 and 412, and 413 and 414, respectively, although in some embodiments their circuitry may also be identical and possibly mirrored around a vertical middle line to simplify the design.

The data processing system supports a single memory package in four-channel mode. The flat order is preserved for this configuration with channels exhibiting both horizontal and vertical symmetry through the example of three signals, representative of a larger number of signals that demonstrate the pattern. Channel 411 has a read clock signal area labelled "RCK" on the left side in the middle of the channel, a data input/output signal area labelled "DQ" on the right side at the top of the channel, and a command and address signal area labelled "CA" on the right side at the bottom of the channel. Channel 414 has an RCK signal area in the middle of the channel, but a CA signal area on the right side at the top of the channel and a DQ signal area on the right side at the bottom of the channel, due to vertical symmetry with channel 411. Channel 412 has a DQ signal area on the left side at the top of the channel, a CA signal area on the left side at the bottom of the channel, and an RCK signal area on the right in the middle of the channel, due to horizontal symmetry with channel 411. Channel 413 has a CA signal area on the left side at the top of the channel, a DQ signal area on the left side at the bottom of the channel, and an RCK signal area on the right in the middle of the channel, due to vertical symmetry with channel 412 and horizontal symmetry with channel 414. This illustration shows the flat order problem with very simple terminal examples, but in various embodiments, the signals from the RCK, DQ, CA, and other signal groups can be intermixed.

Memory controller PHY channel 522 thus has a flat order for channel 411 in the order RCK, DQ, CA, and memory controller PHY channel 524 has a flat order for channel 411 in the reverse order of CA, DQ, RCK, allowing the use of the same memory controller PHY channel for both in a mirrored configuration without redesign. Memory controller PHY channel 521 has a flat order for channel 414 in the order RCK, CA, DQ, and memory controller PHY channel 523 has a flat order for channel 413 in the reverse order of DQ, CA, RCK, allowing the use of the same memory controller PHY channel for both in a mirrored configuration without redesign. The slightly different flat orders for memory controller PHY channel 521 and 522, as well as 523 and 524, can be handled by package routing, allowing the identical, with mirroring, PHY designs to be used.

In summary, the unique orders for each channel are: A (RCK, DQ, CA); B (CA, DQ, RCK); C (DQ, CA, RCK); and D (RCK, CA, DQ), in which the A and B flat orders are mirrored, the C and D flat orders are mirrored, but A and D, and B and C, are not mirrored. Three signals are chosen for this example since that is the minimum needed to show the 4 unique flat orders.

Figure 6:
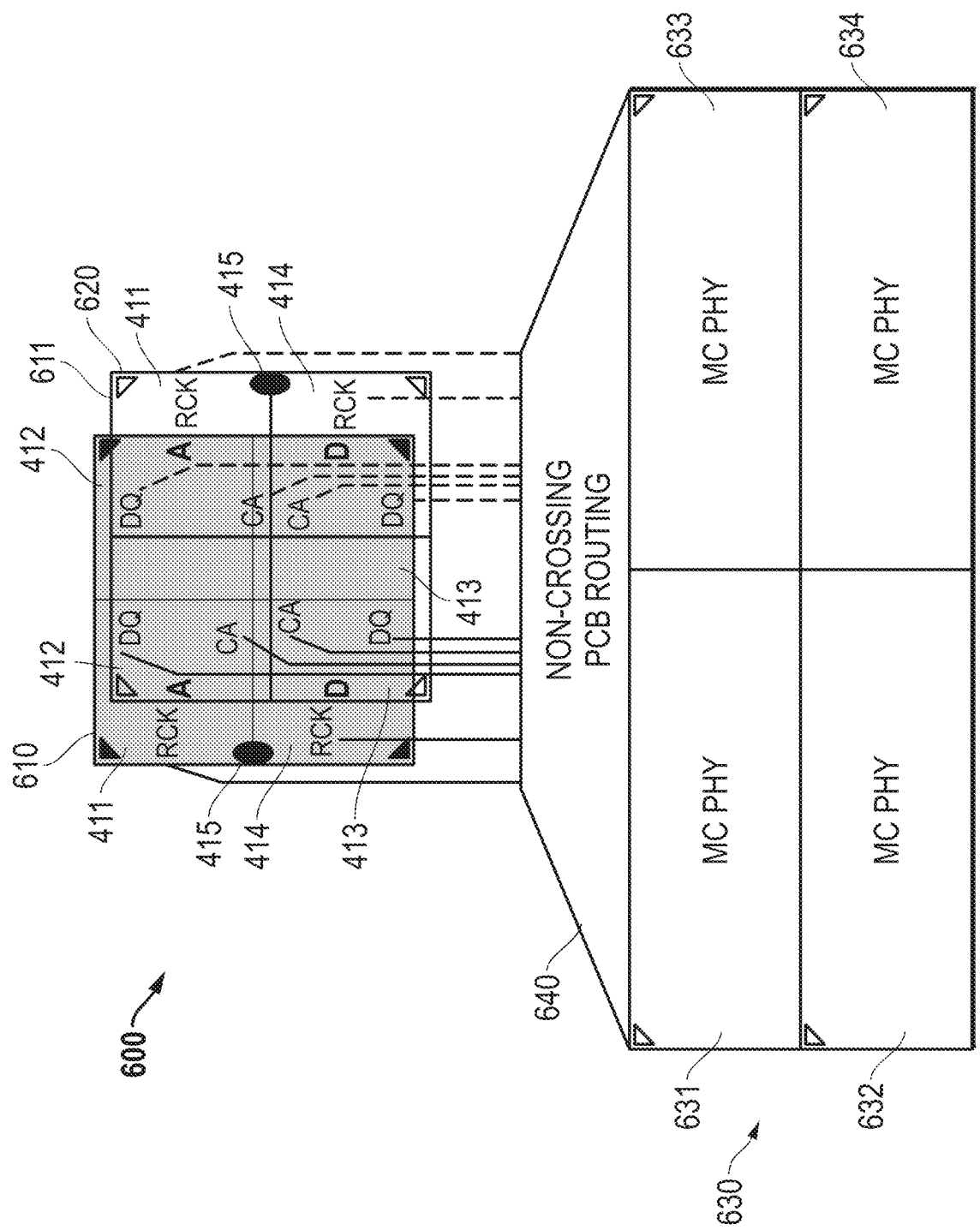
FIG. 6 illustrates in block diagram form a layout of a circuit board using two memory packages in a clamshell configuration according to some embodiments.

FIG. 6 illustrates in block diagram form a layout of a circuit board 600 using two memory packages in a 2-channel clamshell configuration according to some embodiments. Circuit board 600 forms a data processing system and includes generally a memory package 610, a memory package 620, a memory controller area 630, and a non-crossing PCB routing 640 between the two. Memory package 610 is a memory package as shown in FIG. 4 on a top side of the PCB, with channel 411, the A channel, located in the top left corner, channel 412, the B channel, located in the top right corner, and so on, in which top and bottom are with respect to an edge of the PCB or with respect to a reference line on the PCB. Memory package 620 is a memory package as shown in FIG. 4 on a bottom side of the PCB, with channel 411, the A channel, located in the top right corner, channel 412, the B channel, located in the top left corner, and so on, in which top and bottom are with respect to the edge of the PCB or with respect to the reference line on the PCB. Thus, memory package 620 is flipped horizontally with respect to memory package 610 to bond to the backside of the PCB.

Memory controller area 630 includes a memory controller PHY channel 631 and a memory controller PHY channel 632 on a left half of memory controller area 630, and a memory controller PHY channel 633 and a memory controller PHY channel 634 on a right half of memory controller area 630. The left and right halves of memory controller area 630 are arranged with horizontal symmetry around a vertical center line and generally correspond to memory controller area 630, to align generally with the ballouts of channels 414 and 411 of memory package 610 and channels 414 and 411 of memory package 620. In the example shown in FIG. 6, memory controller PHY channels 631 and 633 have active signal routings to channel 414 on memory package 610 and channel 414 on memory package 620 respectively, using a first PCB layer, generally designated layer X. Memory controller PHY channels 632 and 634 have active signal routings to channels 411 on memory package 610 and channel 411 on memory package 620, respectively, using a second PCB layer, generally designated layer Y.

The data processing system supports dual memory package in a two-channel clamshell mode. The flat order for this configuration is the same as in four-channel mode, in which the orders for each channel are: A, top package (RCK, DQ, CA); A, bottom package (CA, DQ, RCK); D, top package (RCK, CA, DQ); and D, bottom package (DQ, CA, RCK).

Figure 7:
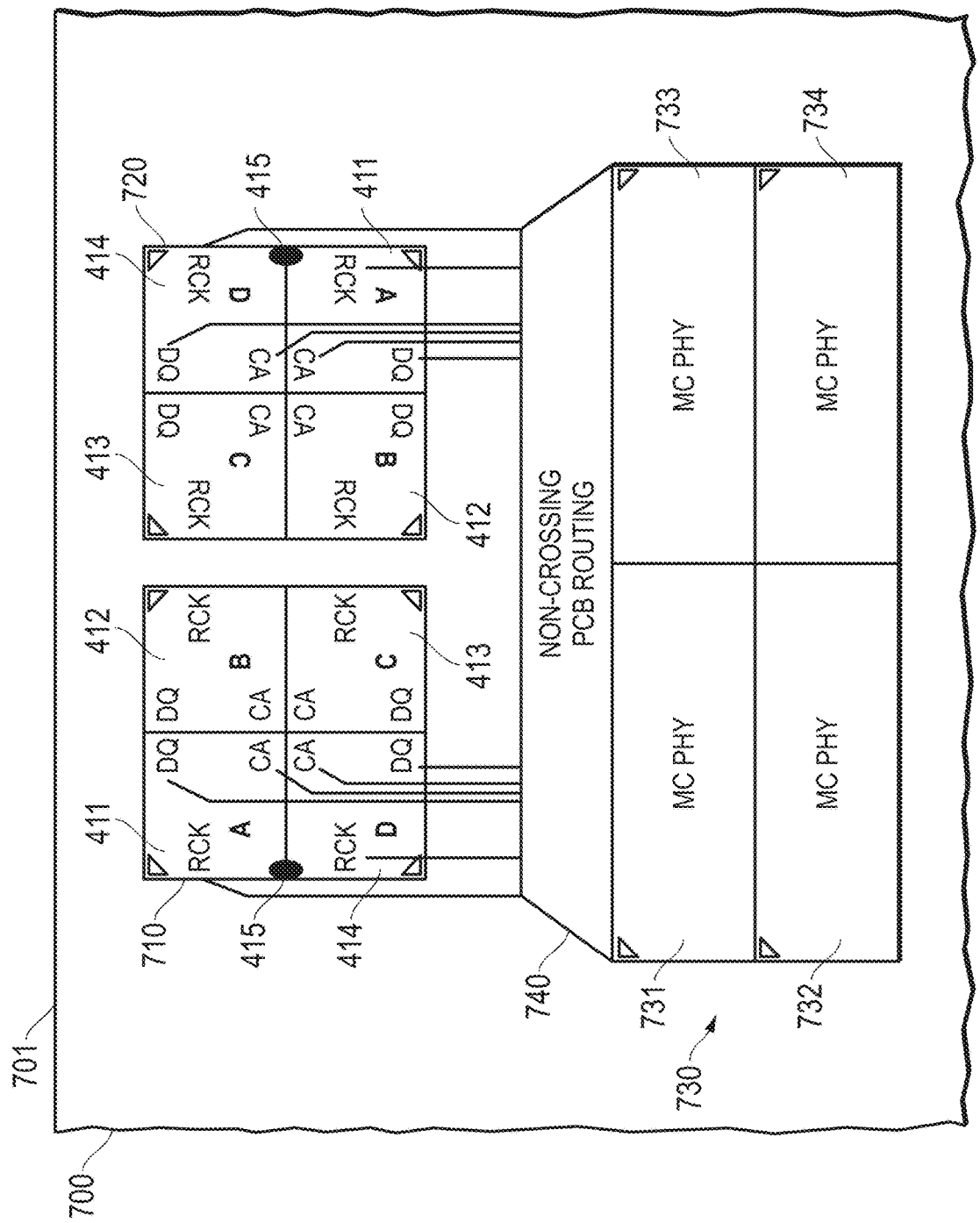
FIG. 7 illustrates in block diagram form a layout of a circuit board using two memory packages in a 2-channel, single-side configuration according to some embodiments.

FIG. 7 illustrates in block diagram form a layout of a circuit board 700 using two memory packages in a 2-channel single-side configuration according to some embodiments. Circuit board 700 forms a data processing system and is formed on a PCB, a portion of which is shown in FIG. 7, and has an edge 701 forming a reference line against which the orientation of the memory package can be described. Circuit board 700 includes generally a memory package 710, a memory package 720, a memory controller area 730, and a non-crossing PCB routing 740 between the two. Memory package 710 is a memory package as shown in FIG. 4 on the top side of the PCB, with channel 411, the A channel, located in the top left corner, channel 412, the B channel, located in the top right corner, and so on, in which top and bottom are with respect to edge 701. Memory package 720 is a memory package as shown in FIG. 4 on the top side of the PCB that is rotated 180 degrees with respect to memory package 710, such that channel 411, the A channel, is located in the bottom right corner, channel 412, the B channel, located in the bottom left corner, and so on, in which top and bottom are also with respect to edge 701 of the PCB. In other embodiments, another reference line not parallel to edge 701 of the PCB can be used.

Memory controller area 730 includes a memory controller PHY channel 731 and a memory controller PHY channel 732 on the left half of memory controller area 730, and a memory controller PHY channel 733 and a memory controller PHY channel 734 on a right half of memory controller area 730. The left and right halves of memory controller area 730 are arranged with horizontal symmetry around a vertical center line and generally correspond to memory controller area 730, to align generally with the ballouts of channels 411 and 414 of memory package 710 and channels 414 and 411 of memory package 720. In the example shown in FIG. 7, memory controller PHYs channel 731 and 733 have active signal routings to channels 414 on memory package 710 and channel 411 on memory package 720, using a first PCB layer, generally designated layer X. Memory controller PHY channels 732 and 734 have active signal routings to channels 411 on memory package 710 and channel 414 on memory package 720 using a second PCB layer, generally designated layer Y.

Memory packages 710 and 720 are placed side-by-side on the top side of the PCB, but memory package 720 is rotated 180 degrees with respect to memory package 710. Because of the DRAMs' symmetry, the flat order is based on each channel's position, but not the channel. Only the four outer channels preserve these flat orders, but since it is in 2-channel mode, the asymmetric flat order of channels 412 and 413 does not affect the operation or cause crossing routes because they are not connected.

The data processing system supports dual memory package in a two-channel (2CH) single-side mode. The flat order for this configuration is the same as in the four-channel mode, in which the orders for each channel are: A, left package (RCK, DQ, CA); D, right package (CA, DQ, RCK); D, left package (RCK, CA, DQ); and A, right package (DQ, CA, RCK).

By changing the initiator channels to channels A and D instead of A and C, memory package 400 supports not only 4-channel single-package and 2-channel clamshell modes, it also supports the new single-side, 2-channel mode in which memory package 710 and memory package 720 can be placed on the same side of the printed circuit board. This new configuration improves the end product by avoiding the need for backside cooling or more PCB routing layers to accommodate otherwise crossing routes. In either case, the system cost is reduced compared to the 2-channel clamshell mode.

Figure 8:
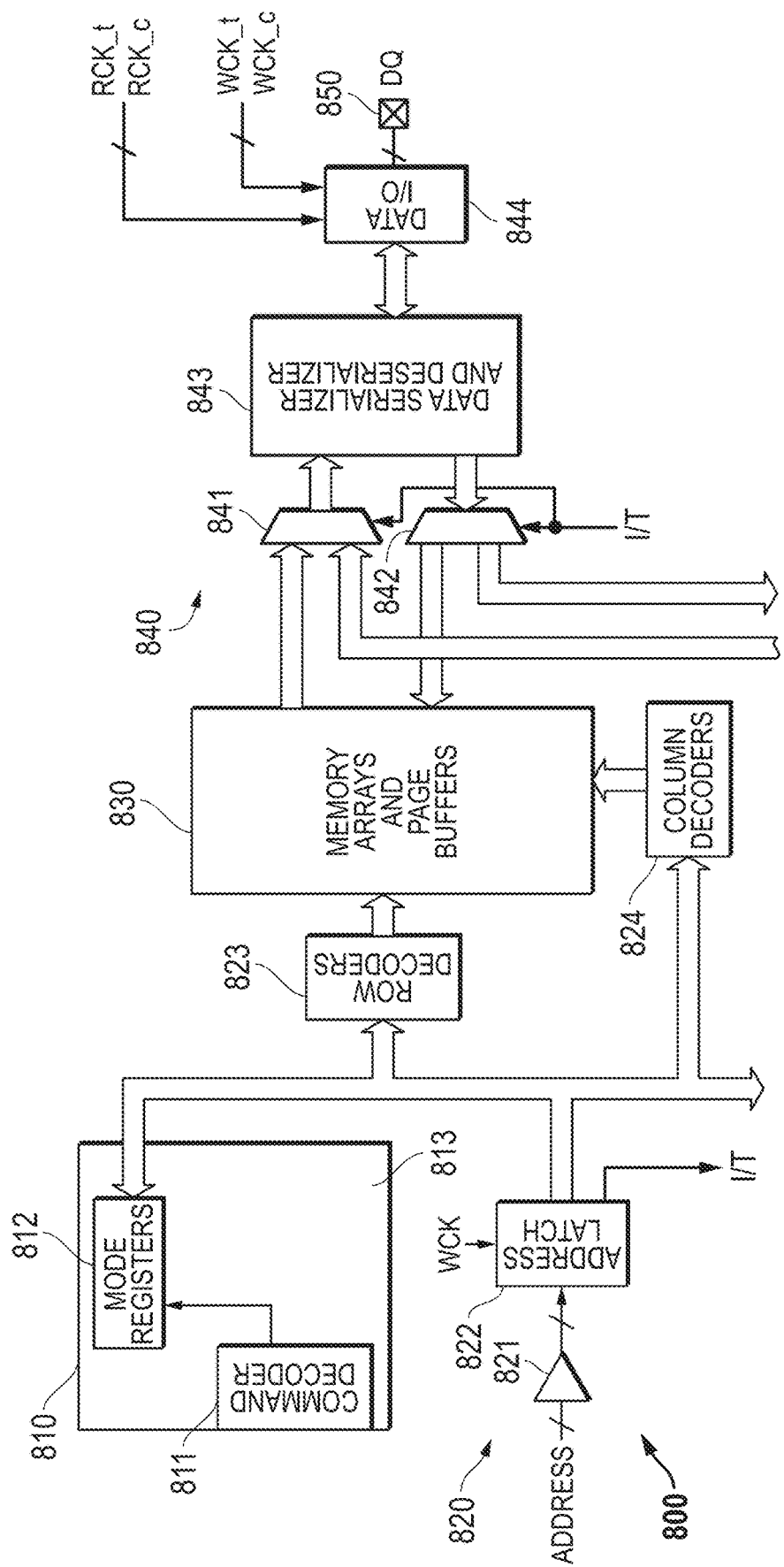
FIG. 8 illustrates in block diagram form a portion of a memory including an initiator channel according to some embodiments.

FIG. 8 illustrates in block diagram form a portion of a memory 800 including an initiator channel according to some embodiments. Memory 800 generally includes a control circuit 810, an address path 820, a set of memory arrays and page buffers 830, a data path 840, and a set of bond pads 850.

Control circuit 810 includes a command decoder 811 and mode registers 812. Command decoder 811 decodes commands received from command and address pins (not shown in FIG. 8) into one of several supported commands defined by the memory's command truth table. One type of command decoded by command decoder 811 is a mode register set (MRS) command. The MRS command causes the command decoder to provide settings to the indicated mode register in which the settings are contained on the ADDRESS inputs. MRS commands have been known in the context of DRAMs for quite some time, and vary between different GDDR DRAM versions. Mode registers 812 store the programmed settings, and in some cases, output information about the GDDR DRAM.

Address path 820 receives a multi-bit ADDRESS signal, and includes an input buffer 821 and an address latch 822 for each address signal, a set of row decoders 823, and a set of column decoders 824. Input buffer 821 receives and buffers the corresponding multi-bit ADDRESS signal, and provides a multi-bit buffered ADDRESS signal in response. Address latch 822 has an input connected to the output of input buffer 821, an output, and a clock input receiving a signal labeled "WCK". Address latch 822 latches the bits of the buffered address on a certain clock edge, e.g., the rising edge, and functions not only as a write clock during write commands but also as the main clock that is used to capture commands. Row decoders 823 have an input connected to the output of address latch 822, and an output. Column decoders 824 have an input connected to the output of address latch 822, and an output.

Memory arrays and page buffers 830 are organized into a set of individual memory arrays known as banks that are separately addressable. For example, memory 800 may have a total of 16 banks. Each bank can have only one "open" page at a time, in which the open page has its contents read into a corresponding page buffer for faster read and write accesses. Row decoders 823 select a row in the accessed bank during an activate command, and the contents of the indicated row are read into the page buffer and the row is ready for read and write accesses. Column decoders 824 select a column of the row in response to a column address.

Data path 840 includes a multiplexer 841, a demultiplexer 842, a data serializer and deserializer 843, and a data input/output (I/O) block 844. Multiplexer 841 has a first input connected to the output of memory arrays and page buffers 830, a second input connected to another channel (not shown), a control input for receiving an initiator/target (I/T) bit, and an output. Demultiplexer 842 has an input, a first output connected to the data input of memory arrays and page buffers 830, a control input for receiving the I/T bit, and an output connected to the other channel. Data serializer and deserializer 843 has an input connected to the output of multiplexer 841, an output connected to the input of demultiplexer 842, and a bidirectional data port. Data I/O block 833 has a first input for receiving a read clock pair RCK_t and RCK_c, a second input for receiving a write clock pair WCK_t and WCK_c, a bidirectional connection connected to the bidirectional connection to Data serializer and deserializer 843, and is connected to a group of data I/O terminals labelled generically "DQ".

In operation, memory 800 allows concurrent operations in the memory banks and channels. In one embodiment, memory 800 is compatible with one of the double data rate (DDR) standards published by the Joint Electron Device Engineering Council (JEDEC), such as the graphics DDR, version 6 (GDDR6) standard. The operation of many of the components in memory 800 is well-known and will not be described in detail. However certain features relevant to the present disclosure will now be discussed.

In general, in order to access data, a memory accessing agent such as GPU 110 activates a row in a memory bank by issuing an activate ("ACT") command. In response to the ACT command, data from memory cells along the selected row are stored in a corresponding page buffer in memory arrays and page buffers 830. In DRAMs, data reads are destructive to the contents of the memory cells, but a copy of the data is stored in the page buffer. After memory controller 114 finishes accessing data in the selected row of a bank, it closes the row by issuing a precharge ("PRE") command (or write or read command with auto-precharge, or a precharge all command). The PRE command causes the data in page buffer 124 to be rewritten to its row in the selected bank, allowing another row to then be activated. These operations are conventional in DDR memories and described in the various JEDEC standard documents and will not be described further.

According to various embodiments disclosed herein, however, memory 800 is organized into channels in which the channels include two initiator channels and two target channels to support 2CH mode. The channel shown in FIG. 8 is an initiator channel. It provides an address bit known as the "I/T" bit to select either it or its paired target channel in a 2CH mode which is based on, for example, a high-order address bit. The I/T signal also controls multiplexer 841 and demultiplexer 842 to either route the data on a narrow bus to either the depicted initiator channel or to/from its paired target channel. It should be apparent that the dual-mode architecture can be implemented in a variety of ways and memory 800 shows only one exemplary way.

Memory package 400 of FIG. 4 and memory 800 of FIG. 8 and various components of circuit boards 500, 600, and 700 of FIGS. 5, 6, and 7, respectively, or any portions thereof, may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high-level design language (HDL) such as Verilog or VHDL. The description may be read by a synthesis tool which may synthesize the description to produce a netlist including a list of gates from a synthesis library. The netlist includes a set of gates that also represent the functionality of the hardware including integrated circuits. The netlist may then be placed and routed to produce a data set describing geometric shapes to be applied to masks. The masks may then be used in various semiconductor fabrication steps to produce integrated circuits. Alternatively, the database on the computer-accessible storage medium may be the netlist (with or without the synthesis library) or the data set, as desired, or Graphic Data System (GDS) II data.

While particular embodiments have been described, various modifications to these embodiments will be apparent to those skilled in the art. For example, while the memory package was disclosed in the context of a graphics double data rate DRAM, the present disclosure is applicable to other types of memory such as SRAM and non-volatile memory, and other types of DRAM such as high-bandwidth memory (HBM), double data rate (DDR) DRAM, static random access memory (SRAM), non-volatile memory of various types, and the like. Moreover, the present disclosure contemplates various routing implementations of printed circuit boards (PCBs) in which the signals from the memory channels have particular signals. For example, the active signals may be routed between the memory controller and the memory on one or more layers, with other layers used as power and ground planes. Also while the embodiments were describes using the example of a 4CH mode and a 2CH mode, other organizations are possible. The vertical and horizontal symmetry of the channels was described with respect to a reference line on a printed circuit board. In various embodiments, the reference line can correspond to an edge of the printed circuit board, or be at an arbitrary angle with respect to the printed circuit board. The initiator and target channels need not be completely identical, but have substantially the same circuitry such that the flat orders of signals from the memory package are symmetric in the horizontal direction to correspond to the signals of memory controller physical interfaces (PHYs). Accordingly, it is intended by the appended claims to cover all modifications of the disclosed embodiments that fall within the scope of the disclosed embodiments.

What is claimed is:

1. A layout of a circuit board, comprising:
a first memory package and a second memory package, each comprising:
  first, second, third, and fourth channels arranged consecutively in a clockwise direction, each of the first, second, third, and fourth channels having memory arrays,
  wherein the first and fourth channels comprise initiator channels and exhibit vertical symmetry around a horizontal middle line;
  the second and third channels comprise target channels and exhibit vertical symmetry around the horizontal middle line;
  the first and second channels exhibit horizontal symmetry around a vertical center line; and
  the third and fourth channels further exhibit horizontal symmetry around the vertical center line,
  wherein in a first mode, the initiator channels and the target channels are independently accessible, and in a second mode, the first channel controls accesses to the memory arrays in the second channel and the fourth channel controls access to the memory arrays in the third channel.

2. The circuit board of claim 1, wherein:
the first memory package is arranged such that the first channel of the first memory package is in a top left position with respect to a reference line of the circuit board, and the second memory package is arranged horizontally adjacent to the first memory package such that the first channel of the second memory package is in a bottom right position with respect to the reference line of the circuit board of the circuit board.

3. The circuit board of claim 1, further comprising:
an integrated circuit processor die comprising a memory controller having first and second memory controller physical channel interfaces coupled to the first and fourth channels of the first memory package, respectively, and third and fourth memory controller physical channel interfaces coupled to the fourth and first channels of the second memory package, respectively.

4. The circuit board of claim 3, wherein:
the integrated circuit processor die comprises a graphics processing unit.

5. The circuit board of claim 3, further comprising:
a non-crossing routing between the first and second memory controller physical channel interfaces and the first and fourth channels of the first memory package, respectively, and between the third and fourth memory controller physical channel interfaces and the fourth and first channels of the second memory package, respectively.

6. The circuit board of claim 1, wherein:
the first channel of each of the first and second memory packages has a first plurality of signals in a first flat order from left to right; and
the second channel of each of the first and second memory packages has a second plurality of signals corresponding to the first plurality of signals in a reverse order.

7. The circuit board of claim 6, wherein:
the third channel of each of the first and second memory packages has a third plurality of signals in a second flat order from left to right; and
the fourth channel of a respective one of the first and second memory packages has a fourth plurality of signals corresponding to the third plurality of signals in the reverse order.

8. The circuit board of claim 6, wherein:
the first plurality of signals of each of the first and second memory packages comprises read clock signals, data signals, and command and address signals.

9. The circuit board of claim 1, wherein:
the first memory package is arranged such that the first channel of the first memory package is in a top left position with respect to a reference line of the circuit board and is located on a first surface of the circuit board, and the second memory package is arranged such that the first channel of the second memory package is in a top right position with respect to the reference line of the circuit board and is located on a second surface of the circuit board opposite the first surface.

10. The circuit board of claim 9, further comprising:
an integrated circuit processor die comprising a memory controller having first and second memory controller physical channel interfaces coupled to the first and fourth channels of the first memory package, respectively, and third and fourth memory controller physical channel interfaces coupled to the fourth and first channels of the second memory package, respectively.

11. The circuit board of claim 10, wherein:
the integrated circuit processor die comprises a graphics processing unit.

12. The circuit board of claim 10, further comprising:
a non-crossing routing between the first and second memory controller physical channel interfaces and the first and fourth channels of the first memory package, respectively, and between the third and fourth memory controller physical channel interfaces and the fourth and first channels of the second memory package, respectively.

13. The circuit board of claim 9, wherein:
the first channel of each of the first and second memory packages has a first plurality of signals in a first flat order from left to right; and
the second channel of each of the first and second memory packages has a second plurality of signals corresponding to the first plurality of signals in a reverse order.

14. The circuit board of claim 13, wherein:
the third channel of each of the first and second memory packages has a third plurality of signals in a second flat order from left to right; and
the fourth channel of a respective one of the first and second memory packages has a fourth plurality of signals corresponding to the third plurality of signals in the reverse order.

15. The circuit board of claim 13, wherein:
the first plurality of signals of each of the first and second memory packages comprises read clock signals, data signals, and command and address signals.

* * * * *